(12) United States Patent
Kim et al.

(10) Patent No.: US 8,039,134 B2
(45) Date of Patent: Oct. 18, 2011

(54) CAN TYPE SECONDARY BATTERY AND METHOD OF MANUFACTURING CIRCUIT BOARD FOR THE SECONDARY BATTERY

(75) Inventors: Yook-young Kim, Yongin-si (KR);
Yoo-eup Hyung, Yongin-si (KR);
Young-boo Cho, Yongin-si (KR);
Jong-ku Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 12/252,579

(22) Filed: Oct. 16, 2008

(65) Prior Publication Data

US 2009/0111003 A1    Apr. 30, 2009

(30) Foreign Application Priority Data

Oct. 30, 2007    (KR) .................. 10-2007-0109720

(51) Int. Cl.
*H01M 2/12*    (2006.01)
*B32B 38/14*    (2006.01)
(52) U.S. Cl. ........................ 429/53; 156/280
(58) Field of Classification Search ............ 429/53
See application file for complete search history.

(56) References Cited

U.S. PATENT DOCUMENTS

2004/0165670 A1* 8/2004 Roy et al. ............... 375/259
2005/0034893 A1* 2/2005 McCall et al. ............ 174/255
2006/0115713 A1   6/2006 Kim et al.
2006/0244390 A1  11/2006 Yang
2006/0275665 A1* 12/2006 Hyung et al. ............ 429/223

FOREIGN PATENT DOCUMENTS

| JP | 6-203871 | 7/1994 |
|---|---|---|
| JP | 11-329402 | 11/1999 |
| JP | 2000-90911 | 3/2000 |
| KR | 2006-0037854 A | 5/2006 |
| KR | 2006 0113002 A | 11/2006 |
| KR | 10-0752468 | 8/2007 |

OTHER PUBLICATIONS

English-language Abstract of KR 10-2005-0119674.
SIPO Office action dated Feb. 16, 2011, for corresponding Chinese Patent application 200810174675.2, noting references previously cited in U. S. Office action dated May 24, 2010.

* cited by examiner

*Primary Examiner* — Patrick Ryan
*Assistant Examiner* — Brent Thomas
(74) *Attorney, Agent, or Firm* — Christie, Parker & Hale, LLP

(57) ABSTRACT

A can type secondary battery and a method of manufacturing a circuit board for the secondary battery that improves reliability by providing a consistent breakdown pressure of the circuit board used in the can type secondary battery. The can type secondary battery includes an electrode assembly, a can to house the electrode assembly and a cap assembly combined with the can. The cap assembly includes a circuit board, which includes fiber layers and is broken by a safety vent when an internal pressure of the can is increased. A woven direction of the fiber layers is inclined with respect to a length direction of the circuit board. Distribution of the breakdown pressure among the circuit boards is decreased, and thus the circuit boards are broken under a consistent pressure, thereby improving the reliability of the can type secondary battery.

18 Claims, 10 Drawing Sheets

CAN TYPE SECONDARY BATTERY AND METHOD OF MANUFACTURING CIRCUIT BOARD FOR THE SECONDARY BATTERY

CROSS-REFERENCE TO RELATED APPLICATIONS

This application claims benefit of Korean Patent Application No. 2007-109720 filed on Oct. 30, 2007 in the Korean Intellectual Property Office (KIPO), the contents of which are hereby incorporated by reference.

BACKGROUND OF THE INVENTION

1. Field of the Invention

Aspects of the present invention relate to a can type secondary battery and a method of manufacturing a circuit board for the can type secondary battery, and more particularly, to a can type secondary battery including a circuit board that can prevent an explosion of the battery, and a method of manufacturing the circuit board.

2. Description of the Related Art

Recently, compact and lightweight portable electronic devices, such as a cellular phone, a portable computer and a camcorder, etc., have been actively developed and produced. The portable electronic devices include a built-in battery pack so as to be operable at places where a separate power supply is not provided. A rechargeable battery is used as the battery pack in consideration of cost. The typical secondary battery includes a nickel-cadmium (Ni—Cd) battery, a nickel-hydrogen (Ni-MH) battery, a lithium (Li) battery, and a lithium ion (Li-ion) secondary battery, etc.

The lithium ion secondary battery has an operating voltage that is three times more than the nickel-cadmium (Ni—Cd) battery or the nickel-hydrogen (Ni-MH) battery, which are usually used as a power supply for the portable electronic devices. In addition, the lithium ion secondary battery has been widely used because it has higher energy density per unit weight.

The lithium ion secondary battery is provided with a protection device to prevent the battery from exploding due to overheating or overcurrent. For example, a thermal breaker breaks a current at the time of overcurrent, or a safety vent opens when an internal pressure of the lithium ion battery is increased. Such protection devices prevent the lithium ion battery from overheating or exploding.

A safety vent and a circuit board may be used as the protection device in a can type secondary battery. When an internal pressure of the secondary battery is increased, the safety vent deforms so as to break a conduction pattern of the circuit board, thereby protecting the can type secondary battery.

However, the circuit board has a complicated structure and high production cost. Accordingly, the circuit board should be manufactured in consideration of a reliability that the circuit board is broken under a desired pressure, a type that the circuit board is installed in a can, production cost, and a manufacturing time. Particularly, the mass-produced circuit boards should be broken under a same pressure during testing so as to satisfy reliability requirements. In addition, the circuit board installed in the can type secondary battery should not be broken by an external impact during or after manufacturing, but should be sensitive enough to be broken by the safety vent. Further, the circuit board should be constructed so as to not occupy a large installation space in the can type secondary battery and so as to be easily installable. The circuit board should be changeable in design without increasing production cost if possible.

SUMMARY OF THE INVENTION

Aspects of the present invention provide a can type secondary battery and a method of manufacturing a circuit board for the secondary battery that can improve reliability by providing a consistent breakdown pressure of the circuit board used in the can type secondary battery.

Aspects of the present invention further provide a can type secondary battery including a circuit board that is resistant to an external impact and sensitively broken by a safety vent, and a method of manufacturing the circuit board.

Aspects of the present invention further provide a can type secondary battery including a circuit board that can improve reliability without an increase of production cost, and a method of manufacturing the circuit board.

According to aspects of the present invention, there is provided a can type secondary battery, which includes: an electrode assembly; a can to house the electrode assembly; and a cap assembly combined with the can and including a cap up, a circuit board disposed between the cap up and the electrode assembly, the circuit board including a circuit pattern and a woven fiber layer, the woven fiber layer having a woven direction which is inclined with respect to a length direction of the circuit board, a safety vent disposed between the circuit board and the electrode assembly, the safety vent being deformable by an internal pressure of the secondary battery to break the circuit board, and an insulation gasket to insulate the cap up, the circuit board, and the safety vent from the can. According to aspects of the present invention, the circuit board may include a plurality of layers. According to aspects of the present invention, the plurality of layers may include a plurality of fiber layers formed so as to cross each other, resin layers formed between the plurality of fiber layers and at upper and lower parts of the plurality of fiber layers; and a circuit pattern disposed on the resin layer.

According to aspects of the present invention, there is provided a can type secondary battery, which includes: an electrode assembly; a can to house the electrode assembly, the can having an opening at one end thereof; and a cap assembly disposed in the opening of the can, the cap assembly including a cap up, a circuit board disposed between the cap up and the electrode assembly, and the circuit board including a plurality of woven fiber layers, resin layers formed between, on top of, and on bottom of the fiber layers, and a circuit pattern disposed on one of the resin layers, and the woven fiber layers of the plurality of woven fiber layers are arranged so as to face each other about of the resin layers formed therebetween, a safety vent disposed between the circuit board and the electrode assembly to break the circuit board, and an insulation gasket to insulate the cap up, the circuit board, and the safety vent from the can. According to aspects of the present invention, the resin layer formed between the fiber layers may be formed thicker than the resin layers formed at upper and lower parts of the plurality of fiber layers.

According to aspects of the present invention, the fiber layer may be formed of a glass fiber or polyimide fiber layers bound together by the resin layers formed therebetween.

According to aspects of the present invention, the circuit board may include an edge part having an annular shape, and a breakdown part formed to cross a central portion of the edge part. According to aspects of the present invention, the fiber layer of the circuit board may be inclined with respect to a length direction of the breakdown part.

According to aspects of the present invention, the breakdown part may include breakdown grooves formed at positions facing each other about a central portion thereof in a direction perpendicular to the length direction of the breakdown part.

According to aspects of the present invention, a bending groove may be formed at a portion where the edge part and the breakdown part connect.

According to aspects of the present invention, the breakdown part may include holes formed at positions facing each other about the central portion thereof in the length direction of the breakdown part.

According to aspects of the present invention, the breakdown part may include a hole formed in the central portion.

According to aspects of the present invention, a method of manufacturing the circuit board for the secondary battery includes: forming an insulation substrate by stacking resin layers between, on top of, and on bottom of woven fiber layers and pressing the upper and lower resin layers together; forming a pattern film on the insulation substrate such that the woven direction of the woven fibers is inclined with respect to a portion of the pattern film corresponding to a length direction of a breakdown part of the circuit board; and patterning the insulation substrate according to the pattern film.

According to aspects of the present invention, in the forming of the insulation substrate, the fiber layers and resin layers may be heated and then pressed. According to aspects of the present invention, in the forming of the pattern film, the insulation substrate may be etched so as to be inclined at an angle of 45° to the woven direction of the fiber layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
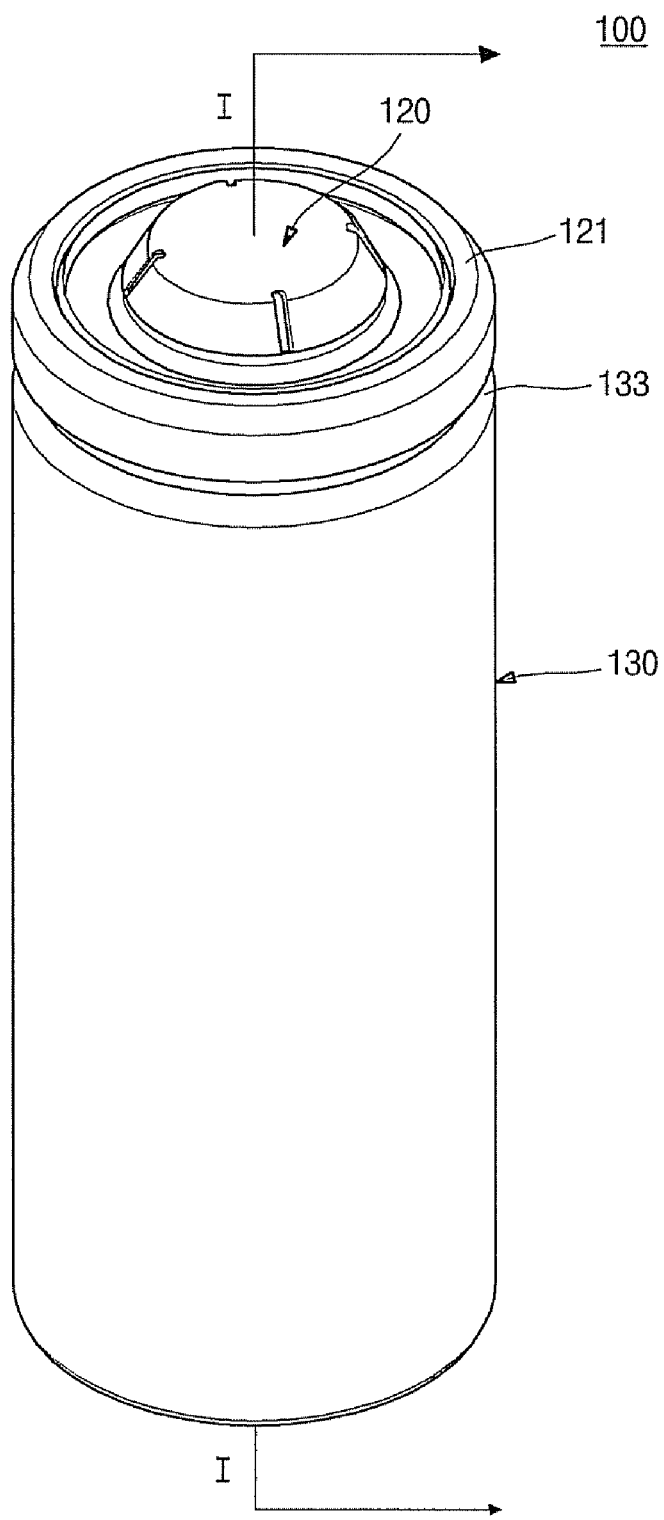
FIG. 1A is a perspective view illustrating a can type secondary battery according to one exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the aspects of the present invention by referring to the figures.

Figure 1B:
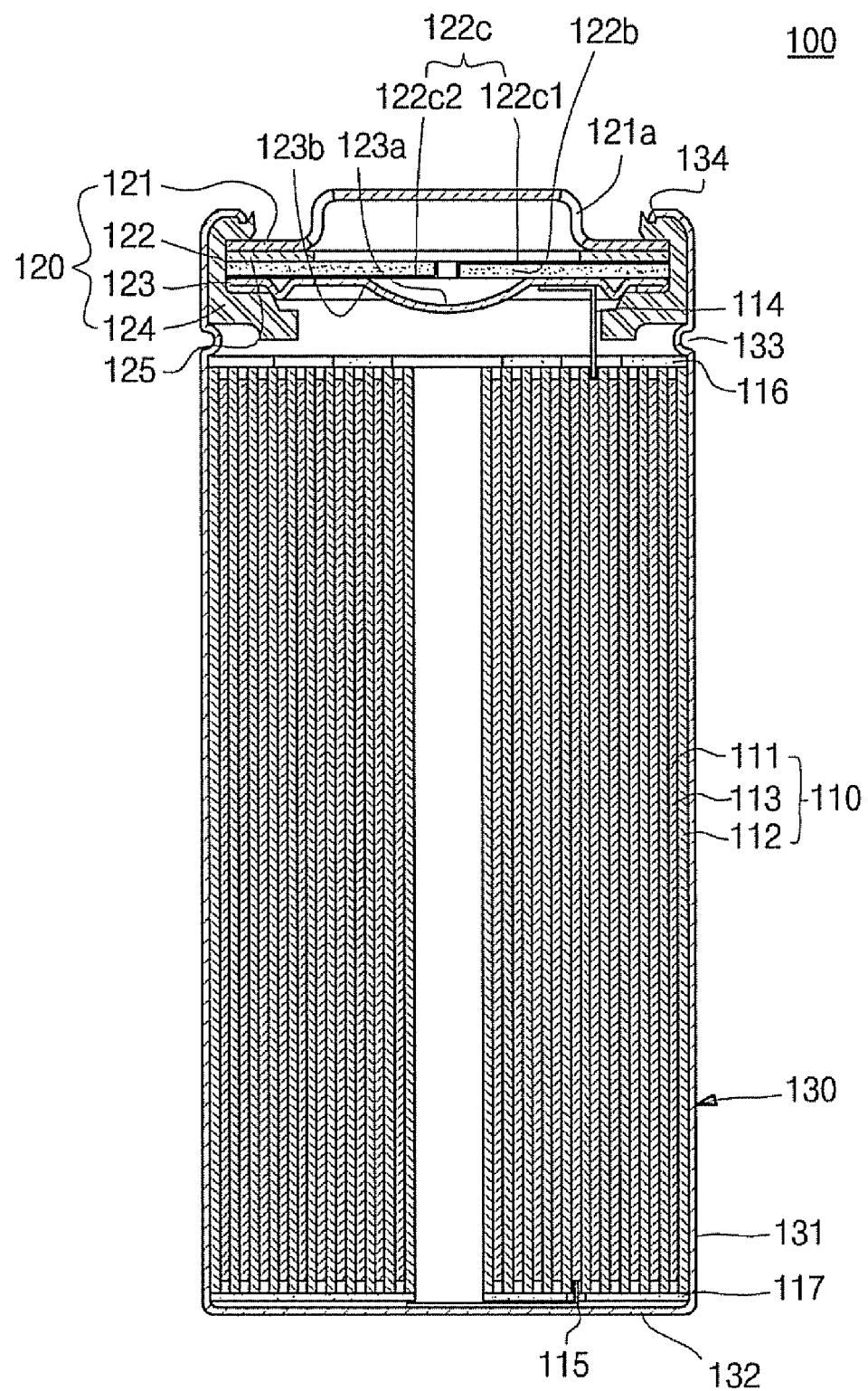
FIG. 1B is a sectional view taken along 'I-I' line of FIG. 1A.
Figure 1C:
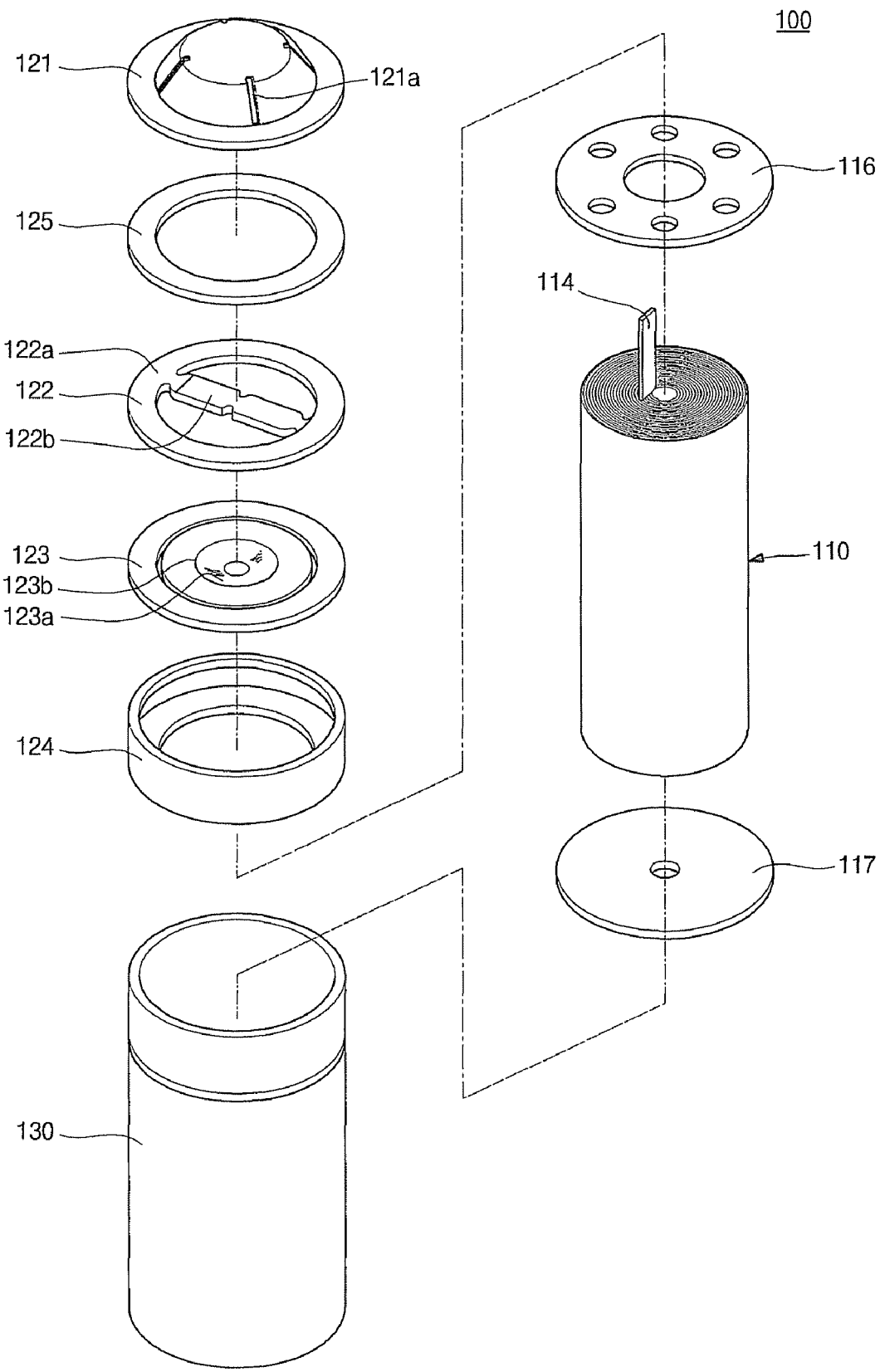
FIG. 1C is an exploded perspective view illustrating the can type secondary battery shown in FIG. 1A.
Figure 1D:
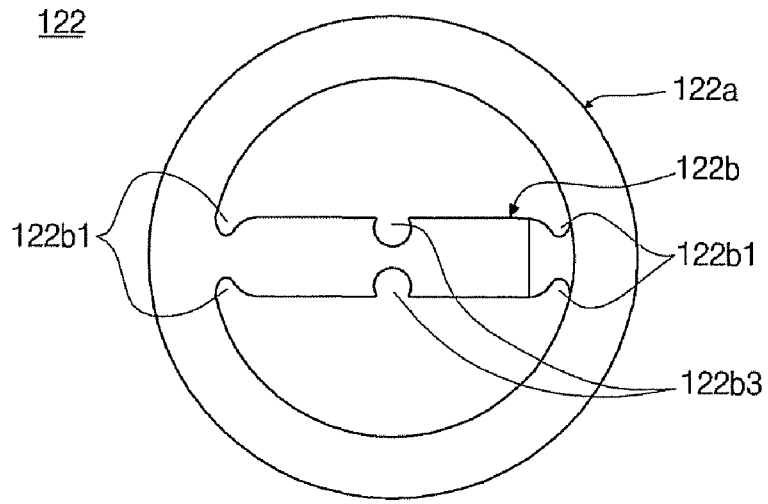
FIG. 1D is a plan view illustrating a circuit board shown in FIG. 1C.
Figure 1E:
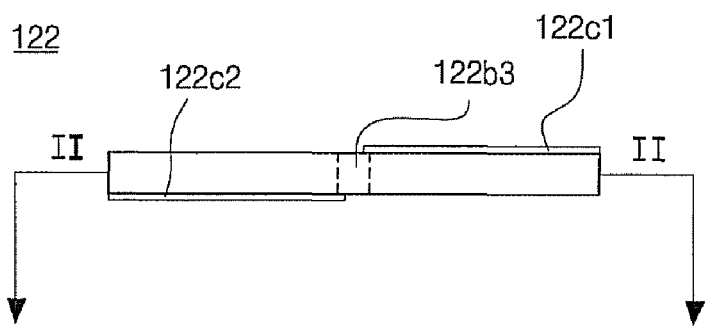
FIG. 1E is a side view illustrating the circuit board shown in FIG. 1D.
Figure 1F:
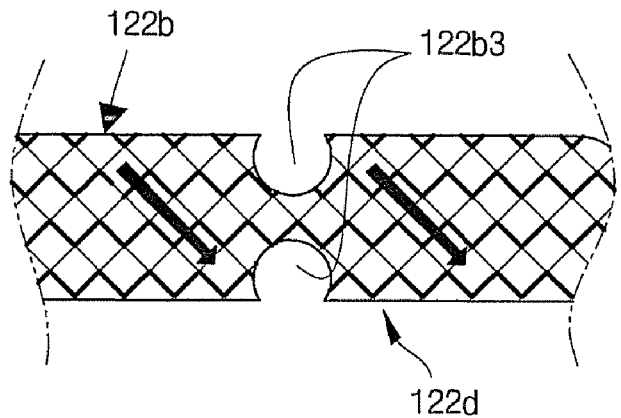
FIG. 1F is a partial sectional view of the circuit board shown in FIG. 1E.
Figure 1G:
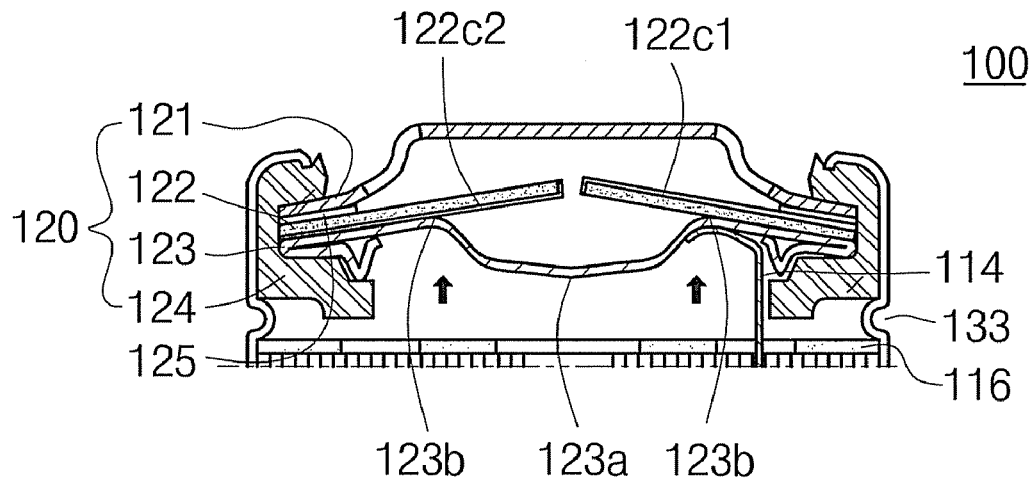
FIG. 1G is a sectional view illustrating a state in which the circuit board is broken by operation of a safety vent of the secondary battery shown in FIG. 1B.
Figure 1H:
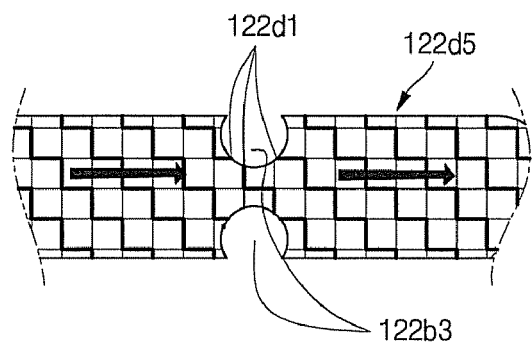
FIG. 1H is a sectional view illustrating a circuit board according to a first comparison example for comparison with the circuit board shown in FIG. 1F.
Figure 1I:
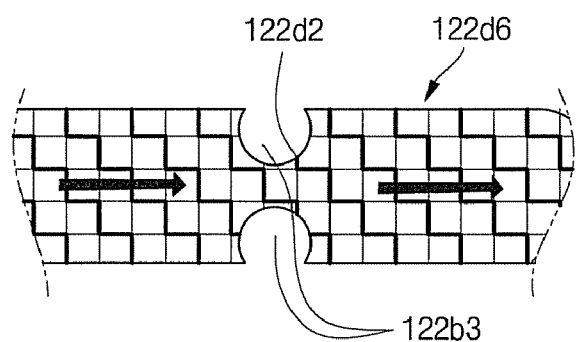
FIG. 1I is a sectional view illustrating a circuit board according to a second comparison example for comparison with the circuit board shown in FIG. 1F.

FIG. 1A is a perspective view illustrating a can type secondary battery according to one exemplary embodiment of the present invention; FIG. 1B is a sectional view taken along 'I-I' line of FIG. 1A; FIG. 1C is an exploded perspective view illustrating the can type secondary battery shown in FIG. 1A; FIG. 1D is a plan view illustrating a circuit board shown in FIG. 1C; FIG. 1E is a side view illustrating the circuit board shown in FIG. 1D; FIG. 1F is a partial sectional view of the circuit board shown in FIG. 1E; FIG. 1G is a sectional view illustrating a state that the circuit board is broken by operation of a safety vent of the secondary battery shown in FIG. 1B and FIG. 1H is a sectional view illustrating a circuit board according to a first comparison example for comparison with the circuit board shown in FIG. 1F; and FIG. 1I is a sectional view illustrating a circuit board according to a second comparison example for comparison with the circuit board shown in FIG. 1F.

Referring to FIGS. 1A to 1C, the secondary battery 100 includes an electrode assembly 110 (not shown in FIG. 1A), a cap assembly 120, and a can 130. The electrode assembly 110 may be formed by stacking a cathode plate 111, an anode plate 112, and a separator 113, and winding the cathode plate 111, the anode plate 112, and the separator 113 together.

The cathode plate 111 includes a cathode collector and a cathode active material layer. The cathode active material layer may include a compound containing lithium, a binder to improve a binding force, and a conductive material to improve conductivity of the cathode active material. The cathode collector is generally made of aluminum, provides a passage for charges generated in the cathode active material layer, and supports the cathode active material layer. A cathode uncoated part (not shown) on which the cathode active material layer is not disposed may be formed on one portion of the cathode plate 111, and a cathode tap 114 may be bonded to the cathode uncoated part.

The anode plate 112 includes an anode collector and an anode active material layer. The anode active material layer may include hard carbon or graphite, and a binder to improve a binding force between the active material particles. The anode collector is generally made of copper, provides a passage for charges generated in the anode active material layer, and supports the anode active material layer. The anode active material layer is disposed on a surface of the anode plate 112.

An anode uncoated part (not shown) on which the anode active material layer is not disposed may be formed on one portion of the anode plate 112, and an anode tap 115 may be bonded to the anode uncoated part.

The separator 113 is disposed between the cathode plate 111 and the anode plate 112 so as to insulate the cathode plate 111 from the anode plate 112, and permits ions from the cathode and anode plates 111 and 112 to pass through. Generally, the separator 113 is made of polyethylene (PE) or polypropylene (PP), but the separator 113 is not limited thereto.

The cap assembly 120 includes a cap up 121, a circuit board 122, a safety vent 123, and an insulation gasket 124. The cap assembly 120 may selectively further include a positive temperature coefficient device 125. In FIGS. 1A to 1C, the positive temperature coefficient device 125 is shown to be included; however, aspects of the present invention are not limited thereto.

The cap up 121 is formed roughly in a circular shape, and includes a centrally-located arc type projection. The cap up 121 includes a plurality of through-holes 121a through which gas generated by the electrode assembly 110 can be discharged. Further, the cap up 121 may be electrically coupled to an upper circuit pattern 122c1 of a circuit pattern 122c formed on the circuit board 122. Here, the positive temperature coefficient device 125 may be disposed between the cap up 121 and circuit board 122 so as to electrically couple them to each other. An internal resistance of the positive temperature coefficient device 125 may be infinitely increased when a temperature of the electrode assembly 110 is increased or an overcurrent flows, thereby breaking a current of the circuit board 122. The positive temperature coefficient device 125 may be a PTC device or a device made of a barium titanate group material. Here, the positive temperature coefficient device 125 may be selectively used. In addition, the cap up 121 may be made of steel, stainless steel, aluminum or the like, but aspects of the present invention are not limited thereto.

As shown in FIG. 1C, the circuit board 122 includes an edge part 122a, a breakdown part 122b, and the circuit pattern 122c. The circuit board 122 is located below the cap up 121. The edge part 122a may be formed in circular ring shape or annular shape, and the breakdown part 122b is formed within the edge part 122a so as to cross a central portion of the edge part 122a, for example, so as to extend as a diameter of the circular ring shape.

The breakdown part 122b is broken by deformation of the safety vent 123. As shown in FIG. 1D, the breakdown part 122b includes breaking grooves 122b3 formed at positions facing each other in a direction perpendicular to a length direction of the breakdown part 122b. The breaking grooves 122b3 may be formed in a central portion of the breakdown part 122b, but aspects of the present invention are not limited thereto such that the breaking grooves may be disposed nearer one end of the breakdown part 122b. The breaking grooves 122b3 allow the breakdown part 122b to be more easily broken when the safety vent 123 is deformed so as to break the portion of the breakdown part 122b in which the breaking grooves 122b3 are formed. In addition, bending grooves 122b1 may be formed at a portion of the breakdown part 122b at which the breakdown part 122b and edge part 122a contact. The bending grooves 122b1 allow the breakdown part 122b to be more easily broken when the safety vent 123 is deformed by an internal pressure increase of the secondary battery 100 so as to break the breakdown part 1 22b. Although the breaking grooves 122b3 and the bending grooves 122b1 are described as being plural, aspects of the present invention are not limited thereto such that one breaking groove 122b3 and/or one bending groove 122b1 may be formed in the breakdown part 122b.

As shown in at least FIGS. 1B and 1E, the circuit pattern 122c includes an upper circuit pattern 122c1 and a lower circuit pattern 122c2. The upper circuit pattern 122c1 is formed on an upper portion of the breakdown part 122b, i.e., facing the cap up 121, and the lower circuit pattern 122c2 is formed on a lower portion of the breakdown part 122b, i.e., facing the safety vent 123. The upper circuit pattern 122c1 and lower circuit pattern 122c2 are electrically coupled to each other in a middle portion of the breakdown part 122b. Further, the upper circuit pattern 122c1 is electrically coupled to the positive temperature coefficient device 125 or the cap up 121, and the lower circuit pattern 122c2 is electrically coupled to the safety vent 123.

Further, as shown in FIG. 1F, the circuit board 122 includes a fiber layer 122d having directionality. The fiber layer 122d may be formed as an interposing layer. The fiber layer 122d is formed by weaving fibers. In such case, the woven direction of the fiber layer 122d included in the circuit board 122 is inclined with respect to the length direction of the breakdown part 122b, i.e., neither the warp or the weft of the woven fiber layer aligns with the length of the breakdown part 122b. An arrow direction shown in FIG. 1F indicates the woven direction of the fiber layer 122d, and the woven direction of the fiber layer 122d is inclined to the length direction of the breakdown part 122b.

As shown in FIG. 1C, the safety vent 123 is located below the circuit board 122. The safety vent 123 is electrically coupled to the cathode tab 114 and the lower circuit pattern 122c2 of the circuit board 122. In addition, the safety vent 123 includes the projection part 123a projected downwardly and is centrally located in the safety vent 123. When the internal pressure of the can 130 is increased, an edge part 123b of the projection part 123a is upwardly expanded so as to lift up the middle part of the circuit board 122, thereby breaking the breakdown part 122b at a portion of the breakdown part 122b in which the breaking parts 122b3 are disposed. When the breaking parts 122b3 are disposed in the central portion of the breakdown part 122b, the breakdown part 122b breaks in the central portion thereof when sufficient pressure is applied by the safety vent 123. Accordingly, the middle part of the circuit pattern 122c is broken by the safety vent 123, thus the cap up 121 is electrically disconnected from the safety vent 123, and the cathode plate 111 of the electrode assembly 110 is electrically disconnected from the cap up 121, resulting in the stoppage of current flow within the second battery 100.

FIG. 1G is a sectional view illustrating a state in which the circuit board 122 has been broken by the safety vent 123. As shown in FIG. 1G, the edge part 123b of the projection part 123a formed at the safety vent 123 is upwardly expanded so as to break the breakdown part 122b of the circuit board 122. As such, the upper circuit pattern 122c1 and lower circuit pattern 122c2 formed on the breakdown part 122b are electrically disconnected. Accordingly, the cap up 121 is electrically disconnected from the safety vent 123, and thus the cap up 121 is electrically disconnected from the cathode plate 111 of the electrode assembly 110.

The insulation gasket 124 surrounds the cap up 121, safety vent 123, and circuit board 122 so as to electrically disconnect them from the can 130, which is an anode electrically connected to the anode plate 112. The insulation gasket 124 may be integrally combined with the cap up 121, safety vent 123, and circuit board 122 so as to seal an opening of the can 130. The process of sealing the opening of the can may be performed by inserting the integrally formed cap assembly 120 into the opening, and then forming a concave beading part 133 at an outer circumference of the can 130 to secure the insulation gasket 124 by the beading part 133. Thus, the opening of the can 130 is sealed by the cap assembly 120. On the other hand, the opening of the can 130 may be sealed by being welded or bonded to the cap up 121, but aspects of the present invention are not limited thereto.

The can 130 has a roughly cylindrical shape and includes a cylindrical body 131 having a certain diameter and a bottom part 132 formed at a lower part of the cylindrical body 131. An upper part is open. Thus, the electrode assembly 110 can be directly inserted into the can 130 through the upper part of the can 130. Here, the anode tab 115 of the electrode assembly 110 may be welded to the bottom part 132 of the can 130, and the cylindrical can 130 can be the anode. In addition, a lower insulation plate 117 and an upper insulation plate 116 may be respectively formed at a lower part and an upper part of the electrode assembly 110 so as to prevent an electrical short between the cathode and anode by insulating them from each other. The can 130 may be made of steel, stainless steel, aluminum or the like, but aspects of the present invention are not limited thereto.

The concave beading part 133 is formed on an outer circumference surface of the can 130. The beading part 133 presses an outer circumference surface of the cap assembly 120, thereby securing the cap assembly 120 from moving toward the electrode assembly 110. In addition, a crimping part 134 is formed at an upper part of the beading part 133. The crimping part 134 is inwardly bent so as to press the insulation gasket 124 toward the beading part 133. The beading part 133 and crimping part 134 strongly fix and support the cap assembly 120 to the can 130, and prevent an electrolytic solution from being leaked to the outside. The electrolytic solution (not shown) is disposed inside the can 130. The electrolytic solution enables lithium ions to move, where the lithium ions are generated by an electrochemical reaction in the anode plate 112 and cathode plate 111 in the secondary battery 100 when the secondary battery 100 is charged/discharged. The electrolytic solution may be a nonaqueous organic electrolytic solution that is a mixture of a lithium salt and a high purity organic solvent. In addition, the electrolytic solution may be a polymer using a polymer electrolyte, but aspects of the present invention are not limited thereto.

In the can type secondary battery 100, the fiber layer formed on the circuit board 122 is inclined to the length direction of the circuit board 122, thereby allowing the circuit board 122 to be broken by the safety vent 123 under a consistent pressure.

Referring to comparison examples shown in FIGS. 1H and 1I, FIG. 1H shows a circuit board according to a first comparison example, and FIG. 1I shows a circuit board according to a second comparison example. Referring to FIGS. 1H and 1I, a woven direction of a fiber layer 122d5 and 122d6 formed on the circuit board is the same as the length direction of the circuit board. Grains 122d1 of fiber layers 122d5 near a breaking groove 122b3 shown in FIG. 1H are connected to the breaking groove 122b3 in a type different from grains 122d2 of fiber layers 122d6 near a breaking groove 122b3 shown in FIG. 1I. In this case, when projections of the safety vent 123 are deformed and hit the circuit boards of the first and second comparison examples under the same pressure, the circuit board of the first comparison example was broken, but the circuit board of the second comparison example was not broken. This is the reason that when grains of the fiber layers formed on the circuit board are formed in the length direction of the circuit board, breakdown pressures of the circuit boards of the first and second comparison examples are inconsistent because the grains of the fiber layers are respectively contacted to the breakdown grooves 122b3 at different points. In addition to this result, in the of the circuit boards of the first and second comparison examples, the plurality of fiber layers are stacked crossing each other, thereby causing the breakdown pressure of the circuit boards to be further inconsistent.

On the other hand, in the circuit board shown in FIG. 1F, the woven direction of the fiber layers 122d formed on the circuit board 122 is inclined with respect to the length direction of the circuit board and the inclined fiber layers 122d are formed so as to be inclined with respect to the breakdown grooves 122b3. Thus, the breakdown pressure of the circuit board 122 is not affected largely. In other words, if the woven direction of the fiber layers formed at the breakdown part 122b the circuit board 122 is formed so as to be inclined with respect to the length direction of the circuit board 122, the breakdown pressure of the circuit board 122 can be kept consistent. Thus, the circuit board 122 is broken without distribution under an initially designed pressure, thereby improving reliability of the can type secondary battery 100. In addition, when the circuit boards 122 are mass-produced and the breakdown pressures are tested by breaking the plurality of circuit boards 122, the breakdown pressures of the circuit boards 122 are maintained consistent, thereby improving the reliability of the mass-produced secondary battery 100. Thus, the can type secondary battery 100 uses the circuit board 122 having a consistent breakdown pressure, thereby improving safety and reliability of the can type secondary battery 100.

Figure 2A:
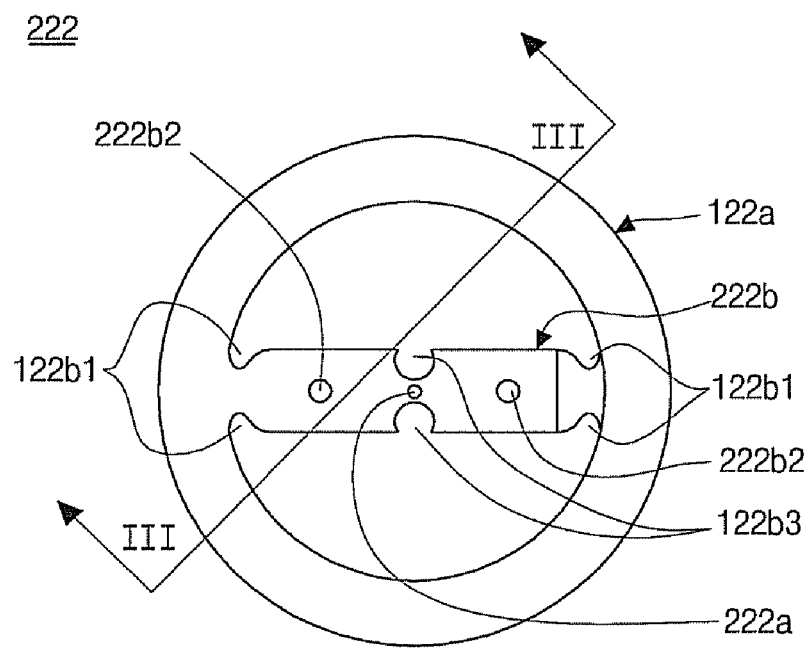
FIG. 2A is a front view illustrating a circuit board according to another exemplary embodiment of the present invention.
Figure 2B:
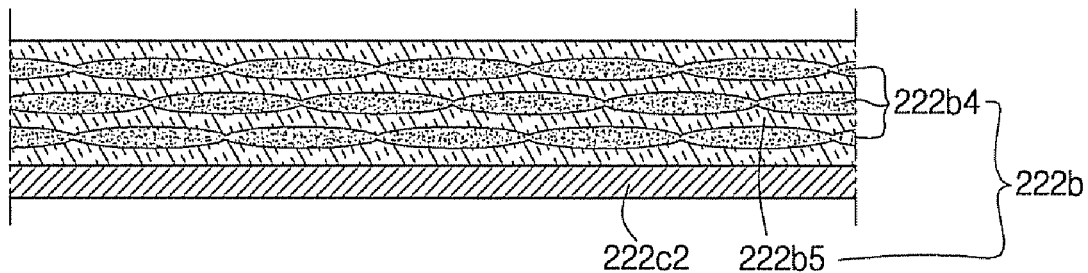
FIG. 2B is a partial sectional view taken along 'III-III' line of the circuit board shown in FIG. 2A.

FIG. 2A is a front view illustrating a circuit board according to another exemplary embodiment of the present invention. FIG. 2B is a partial sectional view taken along 'III-III' line of the circuit board shown in FIG. 2A. Referring to FIG. 2A, the circuit board 222 includes a middle hole 222a formed in the middle part of a breakdown part 222b. The middle hole 222a allows the breakdown part 222b to be easily broken when a safety vent 123 deforms due to an internal pressure of the secondary battery 100. Here, a conduction pattern (not shown) may be formed on the middle hole 222a by plating so as to electrically couple an upper circuit pattern (not shown) to a lower circuit pattern (not shown).

The breakdown part 222b includes holes 222b2 formed at positions facing each other about the middle part of the breakdown part 222b in a length direction of the breakdown part 222b. The hole 222b2 enables the breakdown part 222b to be easily bent. Thus, when the safety vent (not shown) deforms the breakdown part 222b, the breakdown part 222b breaks upon a pressure applied by the safety vent, thereby improving reliability.

According to a sectional view of the circuit board 222 in FIG. 2B, the circuit board 222 includes a fiber layer 222b4, a resin layer 222b5, and a circuit pattern 222c2.

The fiber layer 222b4 may be stacked in plural numbers and formed by weaving a glass fiber or a polyimide fiber. In the stacked form of the plural fiber layers 222b4, fibers of the fiber layer 222b4 contacting to each other may be formed so as to cross each other. In other words, the fibers of the upper and lower fiber layers are crossed with each other so as to decrease vacant space formed therebetween when the plural fiber layers 222b4 are stacked. Or another way, the warps and the wefts of the adjacent fiber layers 222b4 may be parallel but not aligned.

The resin layer 222b5 is formed together with the fiber layer 222b4. The fiber layer 222b4 may be made of an epoxy resin or a bakelite type resin used in an insulation substrate, but aspects of the present invention are not limited thereto.

The circuit pattern 222c2 is formed so as to be pressed to the fiber layer 222b4. The circuit pattern 222c2 may be formed by heating the fiber layer 222b4, and pressing the fiber layer 222b4 together with a thin plate such as a copper foil so as to combine them with each other. Then, the circuit pattern 222c2 may be formed by etching.

The circuit board 222 includes a plurality of fiber layers 222b4 stacked with the resin layer 222b5. The circuit board 222 may have a structure resistive to a compression pressure or a tension pressure applied to the upper and lower parts of the circuit board 222 due to the stack structure of the plurality of fiber layers 222b4. The circuit board 222 provides durability so as to endure external impacts, such as the compression pressure or tension pressure applied to the upper and lower parts of the circuit board 222 when the cap assembly is integrally assembled. In addition, the fiber layers 222b4 of the circuit board 222 are formed so as to cross each other, thereby reducing a thickness of the circuit board 222. The breakdown part 222b of the circuit board 222 is formed thinner, and thus can be easily broken upon deformation of the safety vent. Thus, according to the circuit board 222, the installation space is reduced when the can type secondary battery 100 is manufactured. In addition, the circuit board 222 is resistant to external impacts; however, the circuit board 222 is broken upon deformation of the safety vent.

Figure 3A:
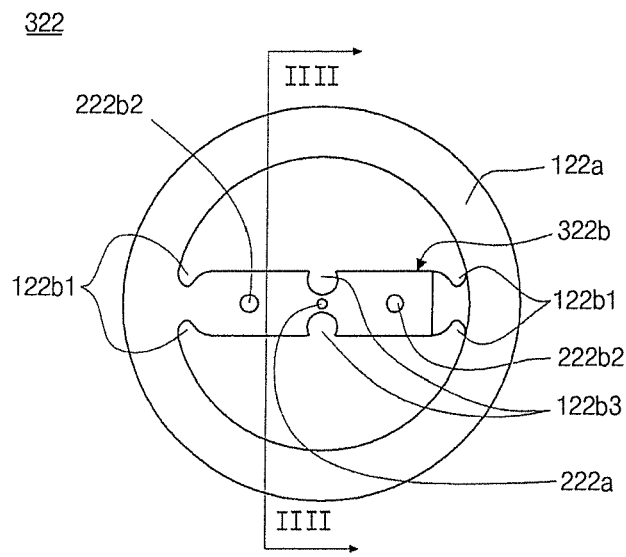
FIG. 3A is a front view illustrating a circuit board according to still another exemplary embodiment of the present invention.
Figure 3B:
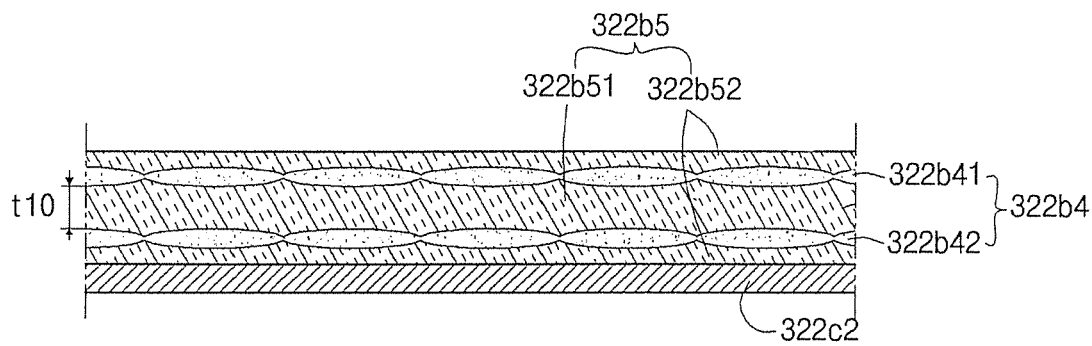
FIG. 3B is a partial sectional view taken along 'III-III' line of the circuit board shown in FIG. 3A.

FIG. 3A is a front view illustrating a circuit board according to still another exemplary embodiment of the present invention, and FIG. 3B is a partial sectional view taken along 'IIII-IIII' line of the circuit board shown in FIG. 3A. Referring to FIGS. 3A and 3B, the circuit board 322 includes a fiber layer 322b4, a resin layer 322b5, and a circuit pattern 322c2.

The fiber layer 322b4 is formed in a plurality of fiber layers. The fiber layer 322b4 may be formed of a glass fiber or an aramid fiber, and the fiber layer 322b4 may be formed by weaving fibers. The fiber layers 322b4 are arranged so as to face an interposed resin layer 322b51 formed between the fiber layers 322b4. In other words, fibers of an upper fiber layer 322b41 and a lower fiber layer 322b42 are stacked so as to form the same projection image when they are vertically projected in a lower direction in FIG. 3B, i.e., the fibers of the plurality of fiber layers of the fiber layer 322b4 align or are symmetric about the interposed resin layer 322b51. Or, at least one of the warps and the wefts of the fiber layers of the plurality of fiber layers may align.

The resin layer 322b5 is formed between the fiber layers and at the upper and lower parts of the fiber layers. The resin layer 322b5 may be formed by slightly melting resins such as an epoxy or bakelite type resin with heat, and pressing the melted resin together with the fiber layer 322b4 so as to combine them with each other. A thickness (t10) of the interposed resin layer 322b51 formed between the upper fiber layer 322b41 and the lower fiber layer 322b42 is formed thicker than those of other resin layers 322b52 formed at the upper and lower parts. The interposed resin layer 322b51 is formed between the upper and lower fiber layers 322b41 and 322b42 so as to be pressed with the other resin layer 322b52 in a state that the fiber layers 322b41 and 322b41 are arranged so as to face each other when the pressing process is performed. Accordingly, the thickness (t10) of the interposed resin layer 322b51 is formed thicker than those of other resin layer 322b52 even if the interposed resin layer 322b51 is pressed with the upper fiber layer 322b41 and lower fiber layer 322b42. Thus, the upper fiber layer 322b41 and lower fiber layer 322b42 are arranged so as to face each other without crossing each other.

The circuit pattern 322c2 is selectively formed at the upper or lower part of the resin layer 322b5. The circuit pattern 322c2 may be formed by pressing a thin plate such as a copper foil to the resin layer with heat so as to combine them with each other and then etching the combined plate. In addition, the circuit pattern 322c2 is formed so as to include a lower circuit pattern (not shown) and an upper circuit pattern (not shown) electrically coupled to the lower circuit pattern. Here, the circuit pattern 322c2 was described above and accordingly, therefore explanation thereof will be omitted.

The length direction of the circuit board 322 is the same as the woven direction of the fiber layers 322b41 and 322b41. Here, the upper fiber layer 322b41 and lower fiber layer 322b42 are arranged at the upper and lower parts of the interposed resin layer 322b51 so as to face each other, thereby keeping the breakdown pressure of the circuit board 322 consistent. That is, because the upper fiber layer 322b41 and lower fiber layer 322b42 are arranged so as to face each other, the binding force is relatively less than that of a circuit board in which the upper fiber layer 322b41 and lower fiber layer 322b42 are formed so as to cross each other, i.e., the circuit board 222. Accordingly, the distribution of the breakdown pressure of the circuit board 322 can be reduced. Thus, even if the length direction of the breakdown part 322b is formed so as to be the same as the length direction of the fiber layer 322b4, the breakdown part 322b formed on the circuit board 322 keeps the breakdown pressure of the circuit board 322 consistent, thereby improving the reliability.

Figure 4A:
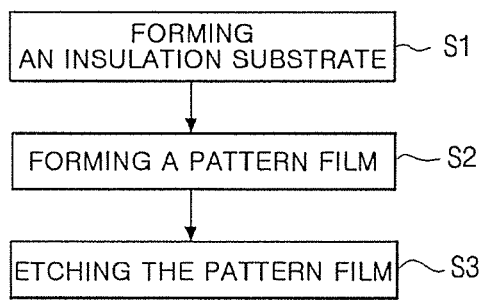
FIG. 4A is a flow chart illustrating a method of manufacturing a circuit board of a can type secondary battery according to still another exemplary embodiment of the present invention.
Figure 4B:
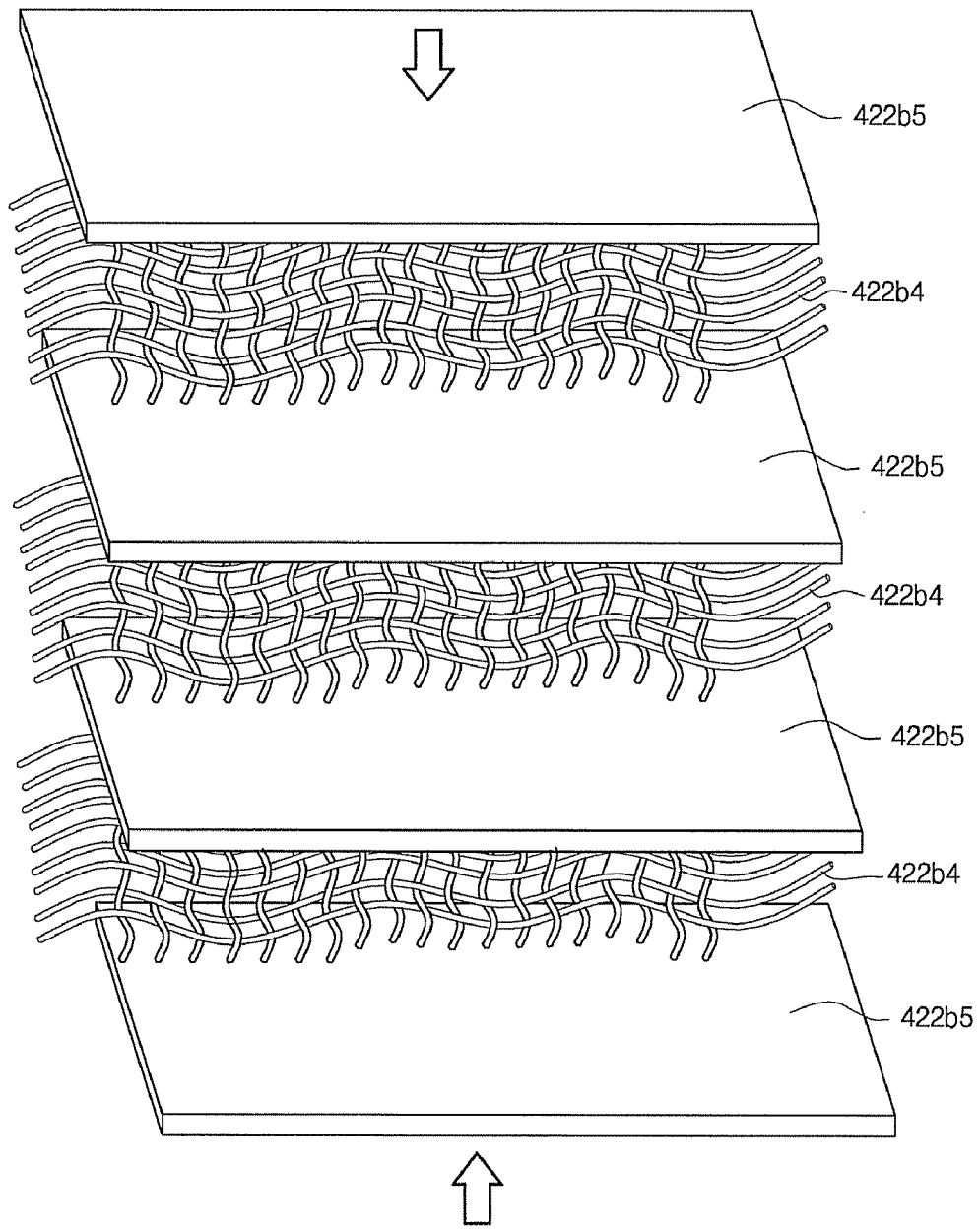
FIGS. 4B to 4E are views illustrating processes of the method of manufacturing the circuit board for the secondary battery according to the flow chart of FIG. 4A.
Figure 4C:
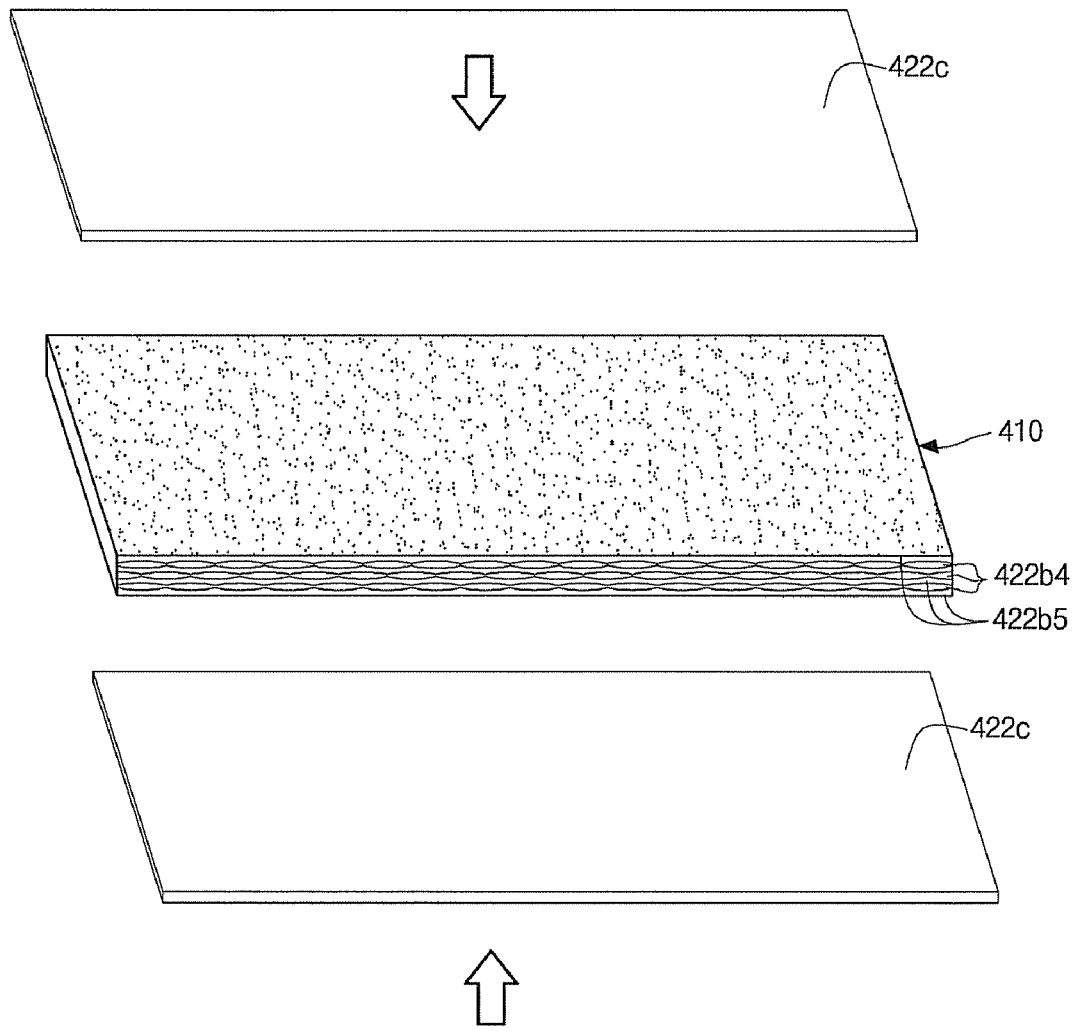
Figure 4D:
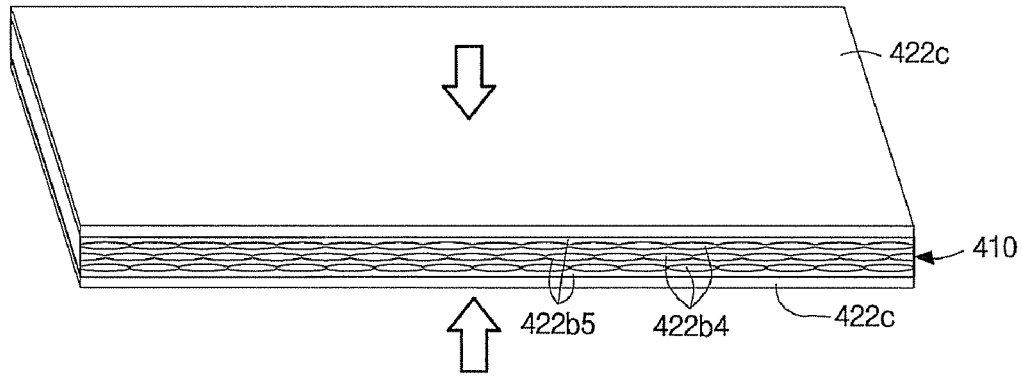

FIG. 4A is a flow chart illustrating a method of manufacturing a circuit board of a can type secondary battery according to still another exemplary embodiment of the present invention and FIGS. 4B to 4D are views illustrating processes of the method of manufacturing the circuit board for the secondary battery according to the flow chart of FIG. 4A. Referring to FIG. 4A, the method of manufacturing the circuit board includes forming an insulation substrate by stacking fiber layers and resin layers and then pressing the fiber and resin layers (S1), forming a pattern film by pressing a pattern film on the resin layer (S2), and etching the pattern film so as to incline the pattern film with respect to the woven direction of the fiber layer formed on the insulation substrate (S3). However, aspects of the present invention are not limited thereto such that, if the resin is a liquid resin, the fiber layers may be compressed together with the liquid resin so as to form fiber layers having resin layers therebetween.

Referring to FIG. 4B, in the operation S1, a fiber layer 422b4 is formed by weaving a glass fiber or an aramid type fiber, and then is pressed at its upper and lower parts with a resin layer 422b5 formed of an epoxy or bakelite type resin. Then, as shown in FIG. 4B, an insulation substrate 410 is formed so as to include the fiber layer 422b4 and the resin layer 422b5 adhered between the fiber layer 422b4. In this time, the pressing process is performed by pressing the previously heated fiber layer 422b4 and resin layer 422b5.

Referring to FIGS. 4C and 4D, in S2, a pattern film 422c, which is a thin plate such as a copper foil, is disposed on the insulation substrate 410. The pattern film 422c may be disposed on one of or both sides of the insulation substrate 410. Then, the pattern film 422c is integrated with the insulation substrate 410 by heating and simultaneously pressing the pattern film 422c.

Figure 4E:
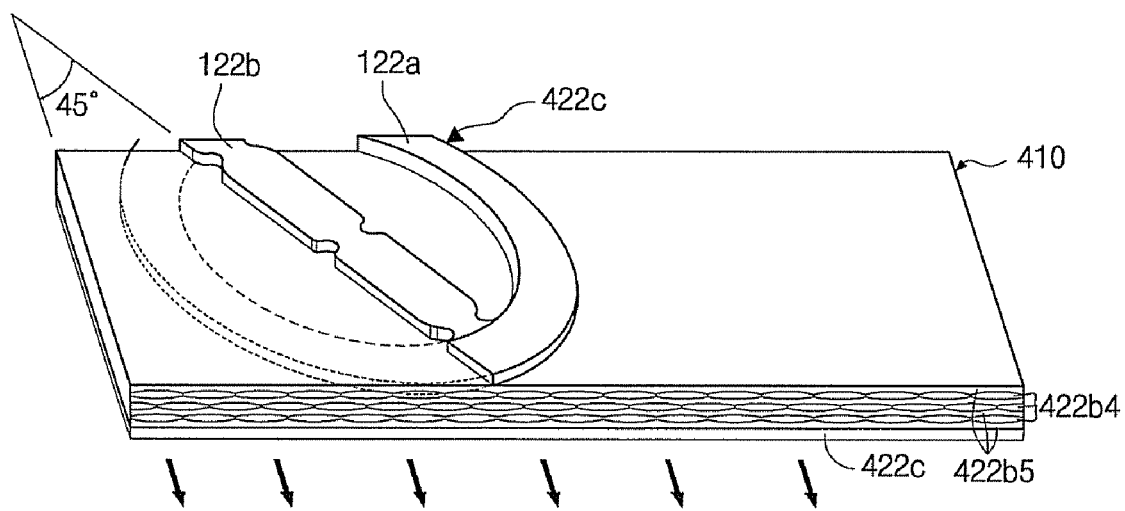

Referring to FIG. 4E, in S3, the pattern film 422c is etched so as to incline the woven direction of the fiber layer 422b4 formed in the insulation substrate 410 to the breakdown part of the circuit board. The woven direction of the fiber layer 422b4 shown in FIG. 4E is indicated by the arrows. The etched circuit board has the shape including the circular edge part 122a and the breakdown part 122b. In addition, the breakdown part 122b is etched so as to be inclined with respect to the woven direction of the fiber layer 422b4. The breakdown part 122b may have an angle of about 45° with respect to the woven direction of the fiber layer 422*b*4, i.e., the breakdown part 122*b* may be inclined at a 45° angle with respect to one of the warp or the weft of the fiber layer 422*b*4. However, aspects of the present invention are not limited thereto such that the angle of the breakdown part 122*b* may differ from 45°. Further, with regard to the embodiments as described above, the woven direction of the fiber layers may align with the breakdown part. Plating processes may be performed to improve conductivity and corrosion resistance after completion of the above-described method. Further, the pattern film 422*c* may be post-processed by using a processing machine, such as a cylindrical saw, a jigsaw, or a drill.

As described above, the can type secondary battery including the circuit board and the method of manufacturing the circuit board according to the present invention produce the following and/or additional effects: First, circuit boards are broken by the safety vent under a consistent pressure because the breakdown pressure distribution is reduced, thereby improving the reliability of the can type secondary battery. Second, the circuit board is resistant to an external impact; however, the circuit board is broken by the safety vent, thereby improving the reliability of the can type secondary battery. Third, the circuit board having an improved reliability can be manufactured without an increase of production cost.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A can type secondary battery, comprising:
    an electrode assembly;
    a can housing the electrode assembly, the can having an opening at one end thereof; and
    a cap assembly in the opening of the can, the cap assembly comprising:
        a cap up electrically connected to the electrode assembly,
        a circuit board between the cap up and the electrode assembly, the circuit board comprising a plurality of woven fiber layers, each of the woven fiber layers having a woven direction which is inclined with respect to a length direction of the circuit board, resin layers formed between, on a first side of, and on a second side of the plurality of woven fiber layers, wherein the resin layer between the woven fiber layers is thicker than the resin layers on the first side and on the second side of the woven fiber layers; and a circuit pattern on one of the resin layers, wherein the circuit board is configured to be fractured by a safety vent;
        a safety vent between the circuit board and the electrode assembly, the safety vent being deformable by an internal pressure of the secondary battery to break the circuit board, and
        an insulation gasket to insulate the cap up, the circuit board, and the safety vent from the can.

2. The can type secondary battery of claim 1, wherein the circuit board comprises:
    an edge part having an annular shape; and
    a breakdown part formed to cross a central portion of the edge part,
    wherein the woven fiber layer is inclined with respect to a length direction of the breakdown part.

3. The can type secondary battery of claim 2, wherein breakdown part comprises breakdown grooves formed at positions facing each other in a direction perpendicular to the length direction of the breakdown part.

4. The can type secondary battery of claim 3, wherein the breakdown grooves are formed about a central portion of the breakdown part.

5. The can type secondary battery of claim 2, wherein a bending groove is formed where the edge part and the breakdown part connect.

6. The can type secondary battery of claim 2, wherein the breakdown part comprises a hole formed in a central portion of the breakdown part.

7. The can type secondary battery of claim 2, wherein the breakdown part comprises holes formed at positions facing each other about a central portion of the breakdown part in the length direction of the breakdown part.

8. The can type secondary battery of claim 1, wherein the woven fiber layer comprises:
    woven glass fiber and/or a woven polyimide fiber layers bound together by resin layers formed between the woven glass and/or polyimide fiber layers.

9. The can type secondary battery of claim 1, wherein the woven direction is inclined with respect to a length direction of the circuit board at about 45°.

10. The can type secondary battery of claim 1, wherein the woven direction is one of a warp and a weft of the fiber layer.

11. A can type secondary battery, comprising:
    an electrode assembly;
    a can housing the electrode assembly, the can having an opening at one end thereof; and
    a cap assembly in the opening of the can, the cap assembly comprising:
        a cap up electrically connected to the electrode assembly, a circuit board between the cap up and the electrode assembly, the circuit board including a plurality of woven fiber layers, a resin layer formed between, on a first side of, and on a second side of the fiber layers; and a circuit pattern on one of the resin layers, wherein the resin layer between the woven fiber layers is thicker than the resin layers on the first side and on the second side of the woven fiber layers; wherein adjacent ones of the woven fiber layers face each other, and wherein the circuit board is configured to be fractured by a safety vent;
        a safety vent located between the circuit board and the electrode assembly and configured to break the circuit board, and
        an insulation gasket to insulate the cap up, the circuit board, and the safety vent from the can.

12. The can type secondary battery of claim 11, wherein the woven fiber layer comprises woven glass fiber and/or woven polyimide fiber layers bound together by the resin layers formed therebetween.

13. The can type secondary battery of claim 11, wherein the circuit board comprises:
    an edge part having an annular shape; and
    a breakdown part formed to cross a central portion of the edge part,
    wherein the woven fiber layers are inclined with respect to a length direction of the breakdown part.

14. The can type secondary battery of claim 13, wherein the breakdown part comprises breakdown grooves formed at positions facing each other in a direction perpendicular to the length direction of the breakdown part.

15. The can type battery of claim 14, wherein the breakdown grooves are formed about a central portion of the breakdown part.

16. The can type secondary battery of claim 13, wherein a bending groove is formed at a part where the edge part and the breakdown part connect.

17. The can type secondary battery of claim 13, wherein the breakdown part comprises a hole formed in a central portion of the breakdown part.

18. The can type secondary battery of claim 13, wherein the breakdown part comprises holes formed at positions facing each other about a central portion of the breakdown part in the length direction of the breakdown part.

* * * * *

UNITED STATES PATENT AND TRADEMARK OFFICE
CERTIFICATE OF CORRECTION

| | | |
|---|---|---|
| PATENT NO. | : 8,039,134 B2 | Page 1 of 1 |
| APPLICATION NO. | : 12/252579 | |
| DATED | : October 18, 2011 | |
| INVENTOR(S) | : Yook-young Kim et al. | |

It is certified that error appears in the above-identified patent and that said Letters Patent is hereby corrected as shown below:

In the Claims

Column 12, Claim 8, line 18.           Delete "a"

Signed and Sealed this
Sixteenth Day of October, 2012

David J. Kappos
*Director of the United States Patent and Trademark Office*